(12) United States Patent
Gao et al.

(10) Patent No.: US 10,465,504 B2
(45) Date of Patent: Nov. 5, 2019

(54) SENSOR DATA COMPRESSION FOR DOWNHOLE TELEMETRY APPLICATIONS

(71) Applicant: Halliburton Energy Services, Inc., Houston, TX (US)

(72) Inventors: Chris Gao, Kingwood, TX (US); Laban M. Marsh, Houston, TX (US); Paul F. Rodney, Spring, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 21 days.

(21) Appl. No.: 15/027,089

(22) PCT Filed: Jul. 28, 2015

(86) PCT No.: PCT/US2015/042416
§ 371 (c)(1),
(2) Date: Apr. 4, 2016

(87) PCT Pub. No.: WO2017/019030
PCT Pub. Date: Feb. 2, 2017

(65) Prior Publication Data
US 2017/0167247 A1 Jun. 15, 2017

(51) Int. Cl.
*E21B 47/12* (2012.01)
*E21B 49/00* (2006.01)
(Continued)

(52) U.S. Cl.
CPC .......... *E21B 47/12* (2013.01); *E21B 47/0002* (2013.01); *E21B 49/00* (2013.01);
(Continued)

(58) Field of Classification Search
CPC .......... H03M 7/30; E21B 49/00; E21B 47/12; E21B 47/0002; E21B 47/122; E21B 47/18
See application file for complete search history.

(56) References Cited

U.S. PATENT DOCUMENTS 5,684,693 A 11/1997 Li
6,285,992 B1 9/2001 Kwasny et al.
(Continued)

FOREIGN PATENT DOCUMENTS

WO 01/63934 A1 8/2001
WO 2007092127 A2 8/2007

OTHER PUBLICATIONS

Singh et al, "Optimal selection of wavelet basis function applied to ECG signal denoising", Digital Signal Processing pp. 275-287, Jan. 27, 2006.*

(Continued)

*Primary Examiner* — Regis J Betsch
*Assistant Examiner* — Jeremy A Delozier
(74) *Attorney, Agent, or Firm* — Gilliam IP PLLC

(57) ABSTRACT

A system having a downhole sensor device and a compression device to obtain a sparse representation of data in downhole telemetry applications is described. The downhole sensor device can collect sensor data while the downhole sensor device is within a borehole. The compression device is coupled to the downhole sensor device and configured to receive the sensor data. The compression device can determine a wavelet coefficient vector for at least one row of n-tuple vectors. The wavelet coefficient vector can have a sparse representation of one or more nonzero elements. The compression device can process the wavelet coefficient vector through a set of compression algorithms, and determine a minimal bit cost of the processed wavelet coefficient vector. The compression device can select a compression algorithm from the set of compression algorithms corresponding to the minimal bit cost. The compression device can generate compressed data based on the selected compression algorithm.

19 Claims, 6 Drawing Sheets

(51) Int. Cl.
    *E21B 47/00*             (2012.01)
    *H03M 7/30*            (2006.01)
    *G01V 1/40*            (2006.01)
    *G01V 3/18*            (2006.01)
    *H03M 7/42*            (2006.01)
    *H03M 7/46*            (2006.01)
    *H03M 7/40*            (2006.01)
    *E21B 47/18*            (2012.01)

(52) U.S. Cl.
    CPC ............... *G01V 1/40* (2013.01); *G01V 3/18* (2013.01); *H03M 7/30* (2013.01); *H03M 7/3059* (2013.01); *H03M 7/3064* (2013.01); *H03M 7/4031* (2013.01); *H03M 7/42* (2013.01); *H03M 7/46* (2013.01); *H03M 7/6064* (2013.01); *E21B 47/122* (2013.01); *E21B 47/18* (2013.01)

(56) References Cited

U.S. PATENT DOCUMENTS

| | | |
|---|---|---|
| 6,671,414 B1 | 12/2003 | Micchelli et al. |
| 6,885,774 B2 | 4/2005 | Ammicht et al. |
| 6,932,167 B2 | 8/2005 | Proett et al. |
| 7,068,182 B2 | 6/2006 | Golla et al. |
| 7,167,101 B2 | 1/2007 | Golla et al. |
| 7,193,541 B2 | 3/2007 | O'Neill |
| 7,272,504 B2 | 9/2007 | Akimov et al. |
| 7,369,161 B2 | 5/2008 | Easwar et al. |
| 7,424,365 B2 | 9/2008 | Hassan et al. |
| 7,788,106 B2 | 8/2010 | Sperschneider et al. |
| 8,204,338 B2 | 6/2012 | Hoppe et al. |
| 2004/0131271 A1* | 7/2004 | Cho ............... H04N 19/63 382/240 |
| 2005/0049827 A1 | 3/2005 | Yuan et al. |
| 2005/0276487 A1 | 12/2005 | Chen et al. |
| 2007/0223822 A1 | 9/2007 | Haugland |
| 2009/0030614 A1* | 1/2009 | Carnegie ............... G01V 1/48 702/6 |
| 2010/0046626 A1 | 2/2010 | Tu et al. |
| 2010/0111432 A1 | 5/2010 | Mohr |
| 2011/0055222 A1* | 3/2011 | Choudur ............... G06F 17/148 707/748 |
| 2011/0264888 A1 | 10/2011 | Dasu et al. |
| 2012/0039385 A1 | 2/2012 | Yilmaz et al. |
| 2014/0056532 A1 | 2/2014 | Charikar et al. |
| 2014/0210652 A1 | 7/2014 | Bartnik et al. |
| 2015/0381981 A1* | 12/2015 | Gelman ............... G01V 1/46 382/109 |

OTHER PUBLICATIONS

International Search Report and Written Opinion received in corresponding PCT Application No. PCT/US2015/042416, dated Feb. 4, 2016.

Shapiro, Embedded Image Coding Using Zerotrees of Wavelet Coefficients, IEEE Transactions on Signal Processing, vol. 41, No. 12, Dec. 1993, pp. 3445-3462.

Mu et al., Embedded Image Coding Using Zerotrees of Wavelet Coefficients for Visible Human Dataset, ICASSP, 2010.

Li et al., Dual X-Tree Wavelet Image Coding, ICSP 2010.

Joseph et al., Speech Compression Using Wavelet Transform, IEEE International Conference on Recent Trends in Information Technology, MIT and Anna University, Chennai, Jun. 3-5, 2011.

International Search Report and Written Opinion for PCT/US2015/042416 dated Feb. 4, 2016.

Canadian Application Serial No. 2,988,401; First Office Action; dated Oct. 4, 2018, 3 pages.

* cited by examiner

SENSOR DATA COMPRESSION FOR DOWNHOLE TELEMETRY APPLICATIONS

BACKGROUND

During drilling operations for the extraction of hydrocarbons, a variety of recording and transmission techniques are used to provide or record real-time data from the vicinity of a drill bit. Measurements of the surrounding subterranean formations may be made throughout oil drilling and exploration operations using downhole measurement and logging tools, such as measurement-while-drilling (MWD) and/or logging-while-drilling (LWD) tools, which help characterize the formations and aide in making operational decisions.

The downhole measurement and logging tools obtain image data, such as, azimuthal density data, AFR (azimuthal focused resistivity) data, ADR (azimuthally deep resistivity), azimuthal acoustic compressional and shear images, acoustic borehole caliper and reflectance, spectral natural gamma ray and non-spectral natural Gamma imaging. The image data is typically transmitted to a surface using mud pulse telemetry techniques. Such techniques are often limited to line-by-line processing, such as, data compression being performed on a row-by-row basis. Transmission of such data typically corresponds to a stringent delay limitation.

Many image compression techniques cannot be applied due to the short length of the data required for uphole transmission. In one approach, compression of image data is based on an assumption that physically adjacent measurements have high probability of being correlated. However, the differences between the adjacent measurements would yield a smaller dynamic range. In another approach, delta modulation provides that when one of the differences in a row of measured data is decoded incorrectly, subsequently decoded elements may not be reconstructed correctly. Secondly, such differences carry only local information. In addition, the decoded values based on delta modulation tend to be more randomly located. As such, structures of formation events cannot be readily reconstructed without a burden on existing compression algorithms.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

DETAILED DESCRIPTION

Figure 1:
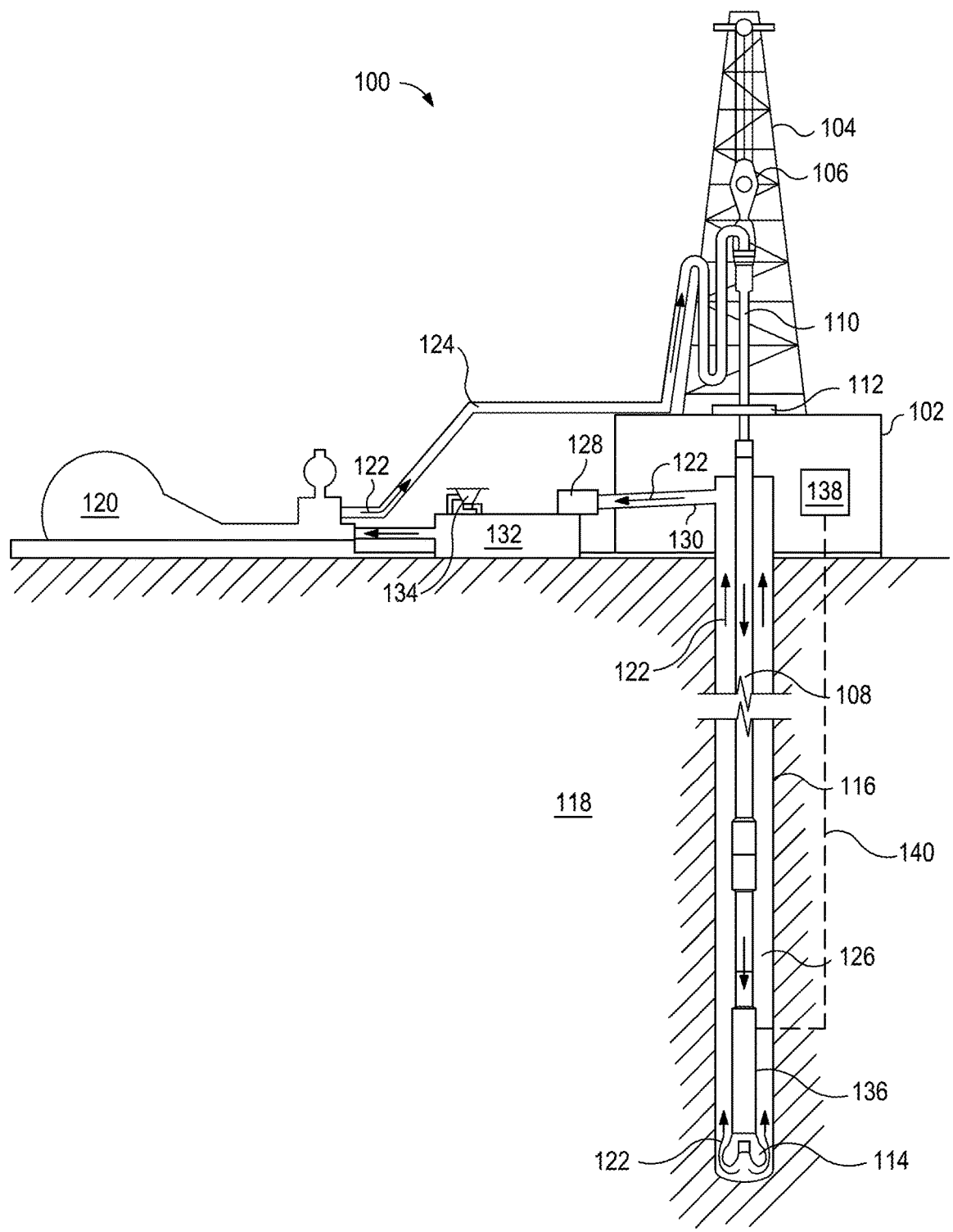
FIG. 1 illustrates an exemplary drilling assembly suitable for implementing the downhole telemetry tools described herein.

Telemetry channels normally available while drilling are sufficiently slow that it is often not possible to continuously transmit images or even updates to an image while drilling, especially while transmitting other information in real time. Hence, there is a need for an efficient means for compressing small portions of an image that can be used to update an image being assembled at the earth's surface.

Uphole transmission of imaging data while drilling poses another unique challenge. The possible efficiency obtainable in compressing an image increases as the image area increases. However, in drilling a well, the rate of penetration is normally very slow (no more than 200 feet/hour, and usually much less). It therefore takes considerable time to develop an image of sufficient size such that significant data compression is achievable. This may be in conflict with the need for frequent image updates for real-time operations while drilling. It is therefore desirable to improve existing compression techniques of downhole sensor data.

Because of the speed at which downhole devices traverse the formations in MWD and LWD systems, formation and/or borehole characteristic values may not rapidly change between readings taken by the downhole devices. Based on this fact, and possibly in order to reduce transmission error propagation in a mud pulse telemetry system, various embodiments of the present disclosure may use a data compression system that can optimize the bit allocation for transmitting the compressed data uphole with a higher effective transmission rate. For example, the higher effective transmission rate may be relative to what would be obtained if image updates, as short data segments, were transmitted without data compression. By compressing the data using an optimal compression algorithm prior to its transmission, it may be possible to reduce the overall number of bits of information, thus increasing the effective data rate.

The present disclosure relates to a data compression system that consists of a set of algorithms that are dynamically used to compress short n-tuple sparse data according to real time operation data conditions. The subject system uses wavelet transformations to pre-process and decompose the raw data into a multi-scale structure. At each scale level, the data characteristics can be extracted with a defined time scope, and the multi-scale structure enables extracting such features from consecutive zooming regions over the entire data row. Such layered separation of the transformed data naturally ranks the wavelet coefficients into perceptual significance orders. As used herein, the term "n-tuple" relates to a row of data where n relates to the data length of the row.

The subject system, besides improving compression efficiency, can mitigate the vulnerability of transmission error propagation. Embodiments presented in the present disclosure provide one or more of the following benefits to image data compression in the following aspects: 1) increased compression rate by 200% or two-fold for 16-bin azimuthal density data, 2) enhanced reliability by eliminating order dependence, 3) facilitated progressive coding, and 4) formulated as a modular system design. The module system design allows one or more compression schemes to be readily added. The present disclosure does not require any modifications to conventional data formats for image data processing, nor does the present disclosure introduce distortion errors larger than the least significant bit.

In some aspects, the subject system includes a downhole sensor device configured to collect sensor data while the downhole sensor device is rotated within a borehole. The subject system includes a compression device coupled to the downhole sensor device. The compression device is configured to receive the sensor data from the downhole sensor device. The sensor data having one or more rows of n-tuple vectors, where n is a positive even integer. The compression device can determine a wavelet coefficient vector for at least one row of the one or more rows of n-tuple vectors. The wavelet coefficient vector can have a sparse representation for an n-tuple vector in the at least one row. The compression device can process the wavelet coefficient vector through a set of compression algorithms. The compression device can determine a minimal bit cost of the processed wavelet coefficient vector based on the set of compression algorithms. The compression device can select a compression algorithm from the set of compression algorithms corresponding to the minimal bit cost. The compression device can generate compressed data based on the selected compression algorithm. The compression device is configured to encode an indication into the compressed data, the indication identifying the selected compression algorithm. The compression device is also configured to send the compressed data uphole from the wellbore to a surface decoder. In some aspects, the compression device sends compressed data to a downhole signaling device or telemetry transmitter to have the compressed data sent uphole to the surface decoder.

FIG. 1 illustrates an exemplary drilling assembly 100 suitable for implementing the LWD and/or MWD tools described herein. It should be noted that while FIG. 1 generally depicts a land-based drilling assembly, those skilled in the art will readily recognize that the principles described herein are equally applicable to subsea drilling operations that employ floating or sea-based platforms and rigs, without departing from the scope of the disclosure.

As illustrated, the drilling assembly 100 may include a drilling platform 102 that supports a derrick 104 having a traveling block 106 for raising and lowering a drill string 108. The drill string 108 may include, but is not limited to, drill pipe and coiled tubing, as generally known to those skilled in the art. A kelly 110 supports the drill string 108 as it is lowered through a rotary table 112. A drill bit 114 is attached to the distal end of the drill string 108 and is driven either by a downhole motor and/or via rotation of the drill string 108 from the well surface. As the bit 114 rotates, it creates a wellbore 116 that penetrates various subterranean formations 118. Along the drill string 108, a downhole tool 136 described herein is included.

In the present application, the downhole tool 136 may be capable of measuring properties of the subterranean formation 118 proximal to the wellbore 116. The downhole tool 136 may transmit the measured data wired or wirelessly to a processor 138 at the surface. Transmission of the data is illustrated at link 140 to demonstrate communicable coupling between the processor 138 and the downhole tool 136 and does not necessarily indicate the path to which communication is achieved. In one or more implementations, the processor 138 may be, or may be a part of, a downhole processor located downhole to carry out encoder operations for transmitting the measured data uphole to the surface.

The downhole tool 136 may include one or more of an azimuthal deep resistivity sensor, an azimuthal focused resistivity sensor, an azimuthal lithodensity sensor, an at-bit inclination sensor, or an at-bit azimuthal gamma ray sensor. For example, the azithumal lithodensity sensor may combine density and photoelectric (Pe) measurements with azimuthal binning of data and an independent acoustic standoff sensor (not shown) for petrophysical evaluation of the subterranean formation 118 (e.g., a reservoir). The downhole tool 136 with the azimuthal lithodensity sensor can obtain measurements relating to formation dip and borehole shape information for geosteering and hole quality applications. In one or more implementations, the downhole tool 136 is constructed with azimuthally responsive sensors distributed azimuthally around a symmetry axis of the downhole tool 136 that make it possible to make measurements of the azimuthal distribution of formation properties without rotating the drill string 108 or sensor package.

A pump 120 (e.g., a mud pump) circulates drilling fluid 122 through a feed pipe 124 and to the kelly 110, which conveys the drilling fluid 122 downhole through the interior of the drill string 108 and through one or more orifices in the drill bit 114. The drilling fluid 122 is then circulated back to the surface via an annulus 126 defined between the drill string 108 and the walls of the wellbore 116. At the surface, the recirculated or spent drilling fluid 122 exits the annulus 126 and may be conveyed to one or more fluid processing unit(s) 128 via an interconnecting flow line 130. After passing through the fluid processing unit(s) 128, a "cleaned" drilling fluid 122 is deposited into a nearby retention pit 132 (e.g., a mud pit). While illustrated as being arranged at the outlet of the wellbore 116 via the annulus 126, those skilled in the art will readily appreciate that the fluid processing unit(s) 128 may be arranged at any other location in the drilling assembly 100 to facilitate its proper function, without departing from the scope of the scope of the disclosure.

Chemicals, fluids, additives, and the like may be added to the drilling fluid 122 via a mixing hopper 134 communicably coupled to or otherwise in fluid communication with the retention pit 132. The mixing hopper 134 may include, but is not limited to, mixers and related mixing equipment known to those skilled in the art. In other embodiments, however, the chemicals, fluids, additives, and the like may be added to the drilling fluid 122 at any other location in the drilling assembly 100. In at least one embodiment, for example, there could be more than one retention pit 132, such as multiple retention pits 132 in series. Moreover, the retention pit 132 may be representative of one or more fluid storage facilities and/or units where the chemicals, fluids, additives, and the like may be stored, reconditioned, and/or regulated until added to the drilling fluid 122.

In one or more implementations, pressure transducers are mounted in one or more locations along the feed pipe 124. The transducers include signal conditioning electronics that may be used to send electrical signals corresponding to pressure impulses to a surface receiver. The surface receiver may consist of an analog front end that is interfaced to the processor 138. In one or more implementations, the processor 138 may be, or may be a part of, the surface receiver. For mud pulse telemetry, the processor 138 may be interfaced to a telemetry channel, which has a relatively low data rate compared to the demand necessary for successful transmission of images in real time. The telemetry channel may be an electromagnetic telemetry channel or an acoustic telemetry channel.

The processor 138 may include a portion of computer hardware used to implement the various illustrative blocks, modules, elements, components, methods, and algorithms for analyzing the measurements described herein. The processor 138 may be configured to execute one or more sequences of instructions, programming stances, or code stored on a non-transitory, computer-readable medium. The processor 138 can be, for example, a general purpose microprocessor, a microcontroller, a digital signal processor, an application specific integrated circuit, a field programmable gate array, a programmable logic device, a controller, a state machine, a gated logic, discrete hardware components, an artificial neural network, or any like suitable entity that can perform calculations or other manipulations of data. In some embodiments, computer hardware can further include elements such as, for example, a memory (e.g., random access memory (RAM), flash memory, read only memory (ROM), programmable read only memory (PROM), erasable read only memory (EPROM)), registers, hard disks, removable disks, CD-ROMS, DVDs, or any other like suitable storage device or medium.

Executable sequences described herein can be implemented with one or more sequences of code contained in a memory. In some embodiments, such code can be read into the memory from another machine-readable medium. Execution of the sequences of instructions contained in the memory can cause a processor 138 to perform the process steps to analyze the measurements described herein. One or more processors 138 in a multi-processing arrangement can also be employed to execute instruction sequences in the memory. In addition, hard-wired circuitry can be used in place of or in combination with software instructions to implement various embodiments described herein. Thus, the present embodiments are not limited to any specific combination of hardware and/or software.

As used herein, a machine-readable medium will refer to any medium that directly or indirectly provides instructions to the processor 138 for execution. A machine-readable medium can take on many forms including, for example, non-volatile media, volatile media, and transmission media. Non-volatile media can include, for example, optical and magnetic disks. Volatile media can include, for example, dynamic memory. Transmission media can include, for example, coaxial cables, wire, fiber optics, and wires that form a bus. Common forms of machine-readable media can include, for example, floppy disks, flexible disks, hard disks, magnetic tapes, other like magnetic media, CD-ROMs, DVDs, other like optical media, punch cards, paper tapes and like physical media with patterned holes, RAM, ROM, PROM, EPROM and flash EPROM.

Figure 2A:
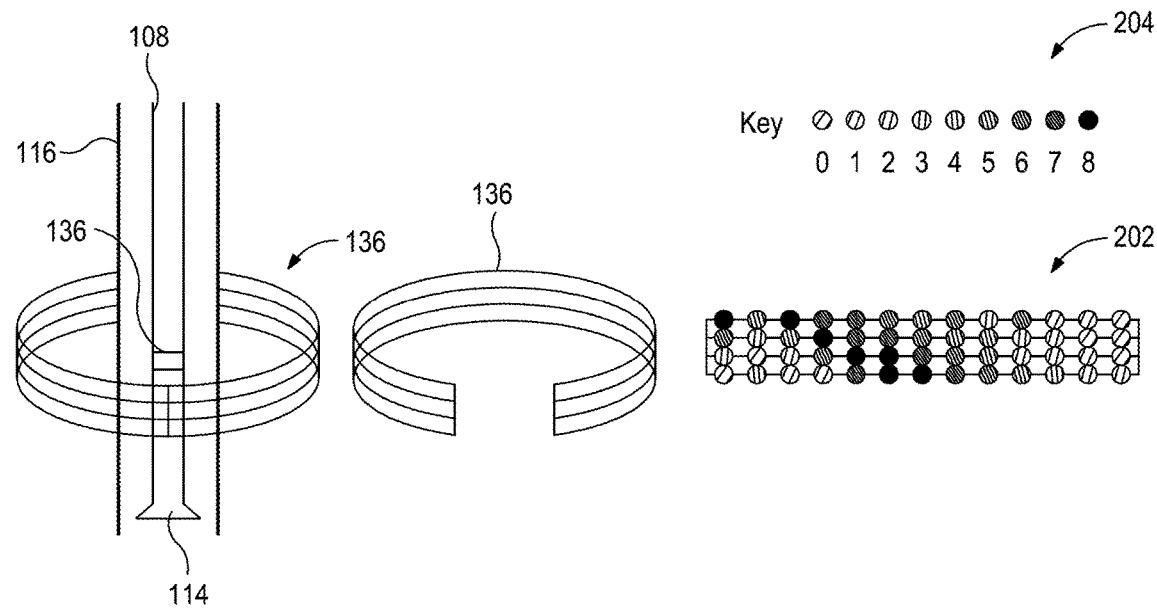
FIGS. 2A-2C are examples of sensor data collected by an azimuthal density data logging tool in accordance with one or more implementations of the present disclosure.
Figures 2B, 2C:
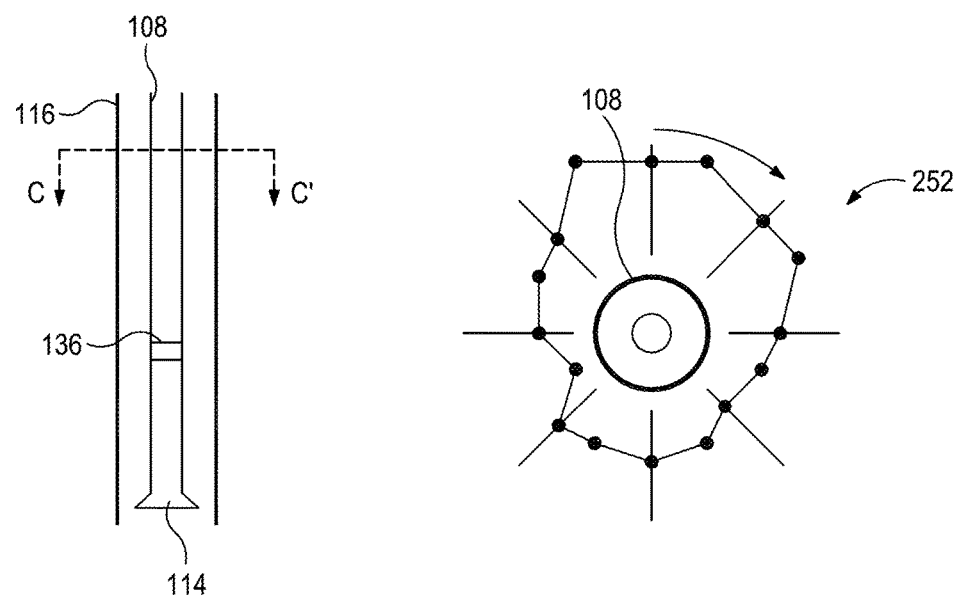

FIGS. 2A-2C are examples of sensor data collection by the downhole tool 136 in accordance with one or more implementations of the present disclosure. FIG. 2A illustrates an example of the downhole tool 136 for collecting data on a row-by-row-basis, FIG. 2B illustrates an example of the downhole tool 136 for collecting sensor data having spatial data points, and FIG. 2C is a cross-sectional top view of the downhole tool 136 illustrated in FIG. 2B. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

In FIG. 2A, the downhole tool 136 is configured to collect sensor data as the downhole tool 136 is rotated within the wellbore 116. In this example, the downhole tool 136 is coupled to the drill string 108, which is rotated about a longitudinal axis along a depth of the wellbore 116. The downhole tool 136 may collect one or more rows of data points 202, where each data point along a row corresponds to a radial orientation of the downhole tool 136. In this example, the downhole tool 136 collects four rows of data points 202 with thirteen data points for each row. As noted by a corresponding key 204, each data point may be designated with a data value representing a certain characteristic of the subterranean formation 118. There may be a range of characteristics available for the petrophysical evaluation of the subterranean formation 118. The corresponding key 204 includes eight different characteristics to define a formation image of the walls in the wellbore 116 but the number of characteristics may vary depending on implementation. The downhole tool 136 may transmit the sensor data on a row-by-row basis via the link 140. In this example, the compressed data may be sent in a transmission vector having a second data length, in which the data length of a single n-tuple vector (corresponding to one row of sensor data) is greater than the second data length. In other words, the rate of collecting measurements downhole is greater than the rate of transmitting the collected measurements uphole.

The downhole tool 136 may be, or may be a part of, an azimuthal density data sensor. The azimuthal density data sensor may be configured to provide density data for petrophysical evaluation of the subterranean formation 118. In this example, the azimuthal density data is typically measured as collections of n-tuple vectors with n being 4, 8 or 16. The azimuthal density data may be measured and stored as 32-tuple vectors, 64-tuple vectors or 128-tuple vectors depending on implementation. The downhole tool 136 also may be, or may be a part of, an azimuthal focused resistivity sensor (AFR) sensor. The AFR sensor may be configured to provide omni-directional laterlog-type resistivity data, electrical images of the subterranean formation 118 or at-bit resistivity measurements. The AFR data is typically measured and stored as 64-tuple vectors while transmitted as 8-tuple or 16-tuple vectors. The downhole tool 136 also may be, or may be a part of, an at-bit azimuthal gamma ray sensor. The gamma ray sensor may be configured to provide borehole images for detecting approaching bed boundaries with gamma ray contrast. The gamma ray image is typically transmitted as 4-tuple or 8-tuple vectors.

In FIG. 2B, the downhole tool 136 may collect data points 252 (FIG. 2C) representing coordinates of the downhole tool 136 relative to the subterranean wellbore 116. FIG. 2C is an azimuthal plot of a parameter measured by the downhole tool 136. The measurement may be from an acoustic caliper, an azimuthally sensitive resistivity tool or the like. Each data point may include mechanical and/or acoustic information obtained along an azimuthal axis around the borehole at a relatively fixed depth in a formation to provide an image of radial dimensions of the wall boundaries surrounding the wellbore 116. In this example, the data points 252 may include data values representing one or more characteristics of the wellbore 116, such as the shape and overall dimensions of the wellbore 116 or the natural gamma ray activity of the subterranean formation 118 at the wellbore wall as a function of the angle of rotation of the downhole tool with respect to an arbitrary reference (or with respect to magnetic north). The wellbore 116 is surrounded by fluid on the interior and solid material on the exterior, while if gas is present, it will be transitory.

Figure 3A:
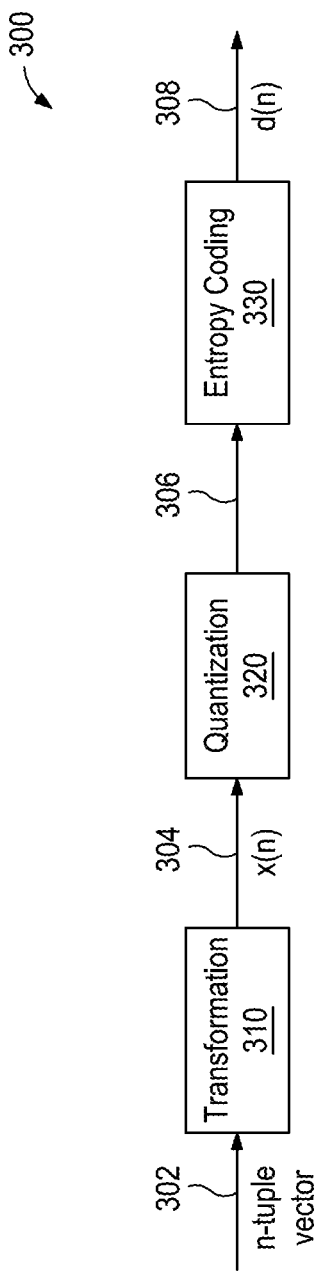
FIGS. 3A and 3B are examples of downhole encoder and surface decoder, respectively, in accordance with one or more implementations of the present disclosure.
Figure 3B:
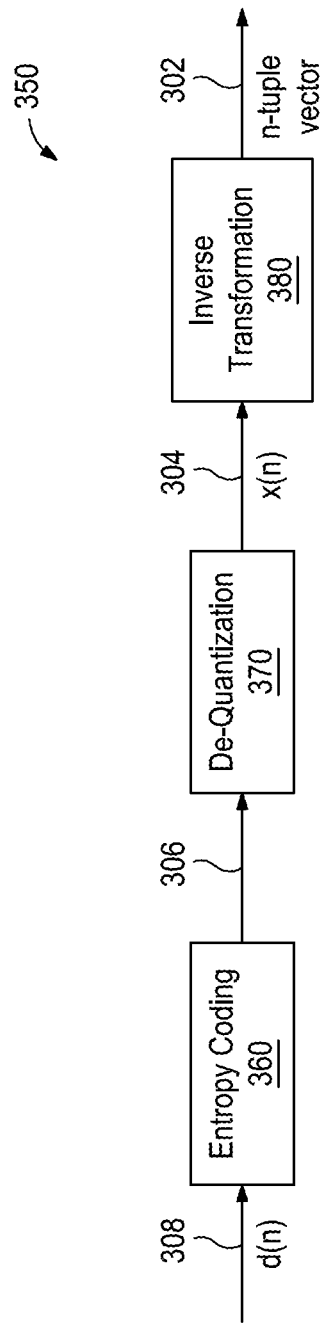

FIGS. 3A and 3B are examples of downhole encoder 300 and surface decoder 350, respectively, in accordance with one or more implementations of the present disclosure. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

In FIG. 3A, the downhole encoder 300 includes a transformation component 310, a quantization component 320 and an entropy coding component 330. In FIG. 3B, the surface decoder 350 includes an entropy decoding component 360, a de-quantization component 370 and an inverse transformation component 380. The downhole encoder 300 is configured to output compressed data to the processor 138 while the surface decoder 350 is configured to receive the compressed data 308 at the surface and reconstruct the original image data. In one or more implementations, the downhole encoder 300 may be, or may be a part of, the downhole tool 136. In one or more implementations, the surface decoder 350 may be, or may be a part of, the processor 138 located at the surface.

Referring to FIG. 3A, an encoding operation includes the downhole encoder 300 performing a transformation on an n-tuple vector 302 (of the collected sensor data) at the transformation component 310 to obtain wavelet coefficients 304 (e.g., x(n)). The collected sensor data may include one or more rows of n-tuple vectors, where n is a positive even integer (e.g., 4, 8, 16, 32, 64, etc.). In this example, the transformation component 310 is configured to apply a wavelet transform to the one or more rows of n-tuple vectors.

In one or more implementations, the transformation component 310 determines a wavelet coefficient vector x(n) for at least one row of the one or more rows of n-tuple vectors. The wavelet coefficient vector also may represent a data structure having a hierarchical arrangement of wavelet coefficients. For example, the wavelet coefficients may form a layered structure (or tree) having correlations or self-similarity features between adjacent layers. In this example, the hierarchical arrangement may consist of a root node and all of its descendants. In the present disclosure, the hierarchical arrangement may be a 4-scale level structure starting from the root node, consisting of all of its descendant nodes and all its ascendant nodes in the wavelet coefficient vector. It should be noted that a 4-scale level is used for a 16-tuple, a 5-scale level is used for a 32-tuple, . . . an n-scale level is used for a $2^n$-tuple. A 4-scale level can be applied to a 32-tuple and a 64-tuple with a loss of resolution. More generally, an n-scale level may be applied to a $2^m$-tuple with a loss of resolution when m>n In this embodiment, the node is numbered from top to bottom and left to right, and the scale levels are counted from top to bottom. For example, a first level (S1 scale level) consists of the root node, a second level (S2 scale level) consists of two descendant nodes of the root node, a third level (S3 scale level) consists of two descendant nodes for each of the descendants in the second level for a total of four descendant nodes, and a fourth level (S4 scale level) consists of two descendant nodes for each of the descendants in the third level for a total of eight descendant nodes.

After quantization, the wavelet coefficient vector may have a sparse representation of non-zero values. In this regard, the transformation component 310 is configured to obtain a sparse representation for each row of the one or more rows of n-tuple vectors.

The wavelet coefficients 304 are then quantized at the quantization component 320 to obtain quantized coefficients 306. The quantized coefficients 306 are then entropy coded at the entropy coding component 330 to then output compressed data 308 (e.g., d(n)) representative of the quantized coefficients.

Referring to FIG. 3B, a decoding operation includes the surface decoder 350 performing an entropy decoding process on the compressed data 308 (received from the downhole encoder 300) at the entropy decoding component 360 to obtain the quantized coefficients 306. The surface decoder 350 then performs a de-quantization process on the quantized coefficients 306 at the de-quantization component 370 to recover the wavelet coefficients 304. The surface decoder 350 then performs an inverse transform (based on the wavelet transform) on the wavelet coefficients 304 at the inverse transformation component 380 to obtain the n-tuple vector 302 for reconstructing the original image data.

As will be discussed in FIG. 4, the downhole encoder 300 may be implemented with a compression system having a set of predefined algorithms that operate on the wavelet coefficients 304 to compute respective bit costs. The compression system may evaluate and determine of which of the algorithms to be used for compressing the original image data by selecting the algorithm that has the minimal bit cost. In one or more implementations, either the quantization component 320 or the entropy coding component 330 includes, or includes a part of, the compression system, or a combination thereof.

In particular, the present disclosure relates to a compression system that processes each n-bin row independently. The main characteristics utilized include 1) perceptual significance order from the wavelet transformation, 2) the tree structures of the nonzero or perceptually less important coefficients, 3) sparsity of non-zero values, and 4) the skewed distribution of the bit allocation dynamic range. The compression system of the present disclosure can achieve two-fold compression gain over existing compression algorithms for azimuthal density data in a range of 1 to 10 sample rows, thus achieving approximately 1.09 bits per bin depending on implementation.

Figure 4:
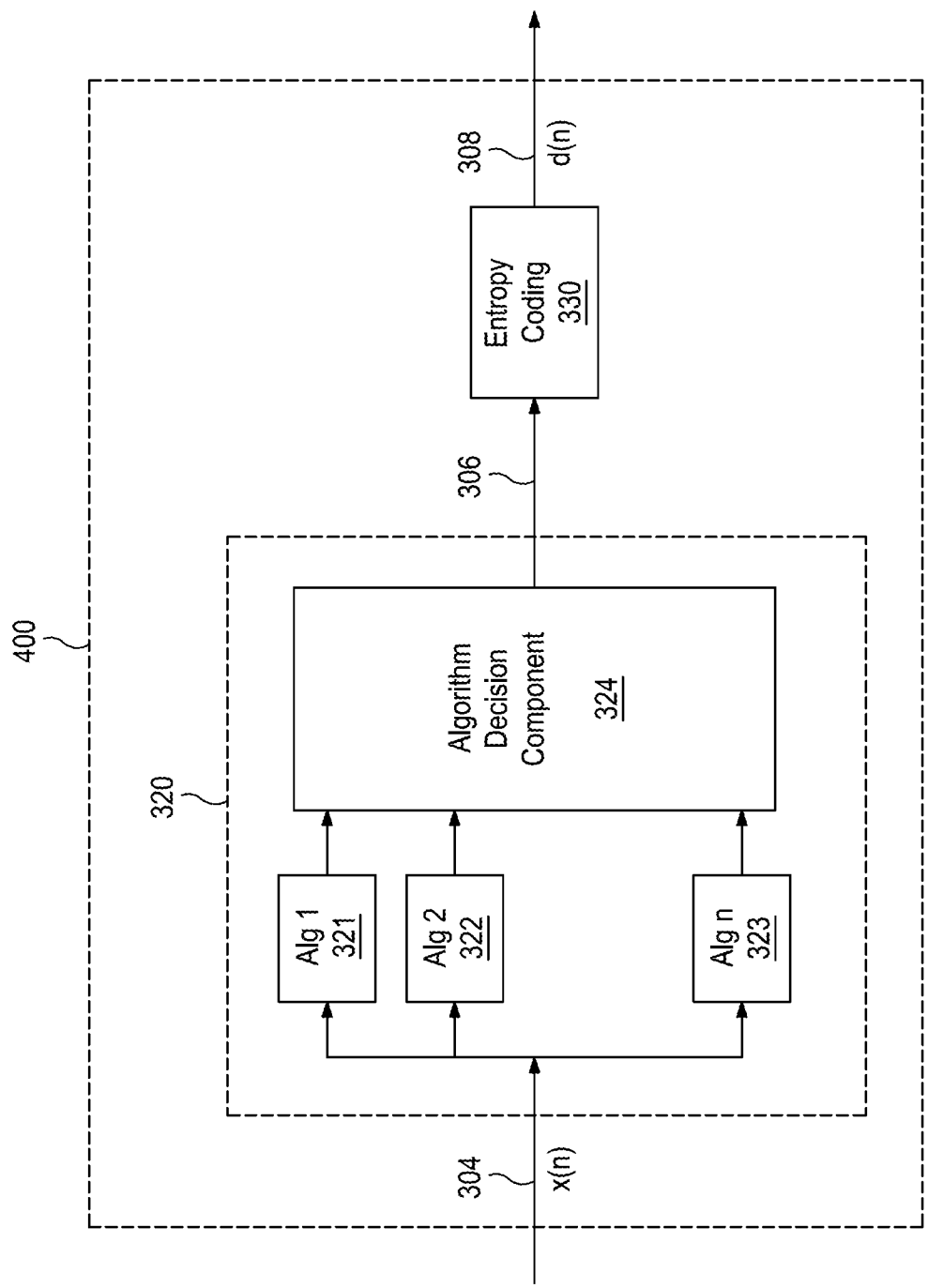
FIG. 4 is an example of a compression system for downhole encoding in accordance with one or more implementations of the present disclosure.

FIG. 4 is an example of a compression system 400 for downhole encoding in accordance with one or more implementations of the present disclosure. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

In FIG. 4, the compression system 400 includes the quantization component 320 and the entropy coding component 330. The quantization component 320 may be configured as a compression device that receives the wavelet coefficients 304 from the transformation component 310 (FIG. 3A) to derive the quantized coefficients 306. In one or more implementations, the wavelet coefficients 304 represent a wavelet coefficient vector x(n) obtained from a single n-tuple image. In other aspects, the wavelet coefficient vector may be obtained from multiple n-tuple images. In this example, the quantization component 320 is implemented with a set of predefined algorithms {$alg_1$ 321, $alg_2$ 322, . . . , $alg_n$ 323} that operate on the wavelet coefficient vector x(n) to compute bit costs for each of the predefined algorithms. For example, the quantization component 320 processes the wavelet coefficient vector through the set of compression algorithms, and each algorithm component 321-323 outputs a bit cost based on the respective algorithm.

The quantization component 320 includes an algorithm decision component 324 that evaluates and determines which of the predefined algorithms 321-323 to be used for compressing the n-tuple image by selecting the algorithm that has the minimal bit cost. For example, the algorithm decision component 324 determines the minimal bit cost by comparing the number of bits needed (or bit cost) from each algorithm. In turn, the algorithm decision component 324 selects a compression algorithm from the set of compression algorithms that yields the smallest number of bits for bit allocation (or minimal bit cost). In one or more implementations, the algorithm decision component 324 sends an indication of the selected compression algorithm to the entropy coding component 330.

The entropy coding component 330 generates the compressed data 308 based on the selected compression algorithm. At the entropy coding component 330, entropy coding is applied to identify the selected algorithm, thereby minimizing overhead in the compressed data 308. In this example, the entropy coding component 330 may encode the indication into the compressed data to notify the surface decoder 350 of the selected compression algorithm. In one or more implementations, the indication may be embedded within a signal carrying the quantized coefficients 306. In other aspects, the indication may be sent separately from the quantized coefficients 306.

The present disclosure discloses at least four compression algorithms but more compression algorithms may be added to the compression system 400 depending on implementation. Each algorithm is designed as a replaceable module to enable system evolution and adaptation. For example, the set of compression algorithms include one or more of a nonzero tree coding scheme, a run-length coding scheme, a priority coding scheme, or an intrinsic mode function coding scheme.

Nonzero Tree Coding Scheme

The present disclosure with respect to the nonzero coding scheme may differ from the above-referenced approaches in the following key aspects: 1) it is based on much shorter length data, such as 8, 16, 32, 64 and in rare cases 128; 2) the distortion error is limited to the least significant bit; 3) the compression system 400 may select to either code the zero-trees or the non-zero trees depending on the number of zeroes in the wavelet coefficients 304; and 4) it applies to one dimensional data.

For wavelet decomposition of image data, we have the following observations: if the wavelet coefficients at a coarse scale are small (e.g., level 1), then the wavelet coefficients at the finer scales at the same location would more likely be small (e.g., levels 2-4). Therefore, it is desirable to make a prediction on the finer scale levels when the values at a coarse scale level are available.

In one or more implementations, the quantized coefficients along a non-zero tree contribute the most to perceptual significance of the original data, and therefore should be preserved and coded accurately. Instead of coding the positions of the zeroes, as a zero-tree coding scheme, the nonzero tree coding scheme is based on the nonzeroes being coded. The rationale may be the same as the zero-tree coding scheme, in which a value change in the data is more likely to be local. In one or more implementations, the compression system 400 is configured to select between the nonzero tree coding scheme or the zero-tree coding scheme based on a number of zeroes in the wavelet coefficient vector.

The wavelet coefficients may include at least four nonzero elements but the number of nonzero elements may vary depending on implementation. In one or more implementations, the nonzero tree coding scheme is applied to an arbitrary number of nonzero values present within the wavelet coefficients 304.

Based on the nonzero tree coding scheme, each tree (or layered structure) is specified by one of the four nodes at the S3 scale level (or third level), which can be referred to as S3-nonzero trees. In one or more implementations, a valid non-zero tree is defined as a S3-nonzero tree when at least three nonzero elements are present within the wavelet coefficients, as listed in Table 1.

TABLE 1

Code Assignment for Dominant Zero Tree

| | ZT Codes | | | |
|---|---|---|---|---|
| | 00 | 01 | 10 | 11 |
| Tree Node Set | {1, 2, 4, 8, 9} | {1, 2, 5, 10, 11} | {1, 3, 6, 12, 13} | {1, 3, 7, 14, 15} |

For the four-nonzero element cases, with the above listed zero-tree or nonzero tree classification, the following compression strategy as part of the nonzero coding scheme can be formulated: (1) code the zero-tree with 2 bits, and (2) locate the nonzero elements with a four-bit segment. If there are three nonzero elements (or wavelet coefficients) on the tree, four additional bits may be used to locate the last nonzero element for a total bit count of eleven bits. In this example, the number of nonzero values on the dominant zero tree may range from one nonzero element to four nonzero elements. The distribution is listed in Table 2.

TABLE 2

Distribution of Nonzero Elements in the Dominant Tree

| | Nonzero Elements | | | |
|---|---|---|---|---|
| | 1 | 2 | 3 | 4 |
| Number of Cases | 89 | 464 | 681 | 66 |
| Percentile | 6.8% | 35.69% | 52.38% | 5.08% |
| Cumulative Percentile | — | 42.54% | 94.92% | — |

Run-Length Coding Scheme

A second feature of the wavelet representation is the sparseness of nonzero wavelet coefficients. For example, about 68% of the wavelet coefficients can contain zero values. For rows with sparse nonzero elements, a run-length coding scheme on zero runs (or a zero-run sequence) of the wavelet coefficients may be implemented as one of the predefined algorithms.

In one or more implementations, the wavelet coefficients may be modeled as a two state Markov model. For example, the Markov model may have two states: 0 and 1, for zero value and nonzero value respectively. The Markov model may be associated with state and transition probabilities. Since the probability parameters may vary dramatically with different numbers of nonzero values (or zero values) for each row (or n-tuple vector), an additional layer of entropy coding may be added to divide the cases.

In one or more implementations, the run-length coding scheme is implemented using individual data rows with at least four nonzero values. In this embodiment, the probabilities of the Markov model states can be defined as: $P(1)=4/15$ and $P(0)=1-P(1)=11/15$. The run-length coding scheme of the present disclosure is configured to exclude short runs and coding cases that have minimal runs (or sequences) of at least four zeroes and above. The run-length coding scheme may impact about 16% of the total cases of the azimuthal density data.

Priority Coding Scheme

When the wavelet coefficients appear more random or close to uniformly distributed, the coefficients may contain values representing unwanted noise. Wavelet transformations typically separate the noise and information into different layers in the layered structure. For example, the lower layers may contain more noise while higher layers contain information or perceptually significant content. The priority coding scheme is based on significance ordering. In this respect, the priority coding scheme includes the following procedure:

Step 1: Code the wavelet coefficients at the third level (S3 scale level) based on the S1 scale level and the S2 scale level.

Step 2: Compute a power ratio of the coded wavelet coefficients over total coefficients. For example, a power ratio may be derived by finding the peak wavelet coefficient and comparing it to the average wavelet coefficient. This is called a PAPR.

Step 3: If the power ratio is less than 1 (e.g., 96%), code the next maximal value in the scale level or lower (such as S4 scale level or fourth level). Then proceed back to Step 2.

Step 4: If the power ratio is approximately 1 (e.g., 96% or higher), process complete.

In one or more implementations, the 96% percentile threshold corresponds to one quantization level but the threshold value may vary depending on implementation. In this embodiment, the distortion tolerance level may be maximized to achieve the maximal compression rate possible. Table 3 shows the effectiveness of masking with priority on the azimuthal density data. When three levels have been coded, approximately 95% of noise-like cases are processed through the priority coding scheme. The percentage of noise-like cases may vary for data with information rich content, including data having visual patterns.

TABLE 3

Effectiveness of Masking with Priority Levels Reached

| 4 | 3 | 2 | 1 |
|---|---|---|---|
| 5.13% | 94.87% | 67.02% | 12.53% |

Intrinsic Mode Function Coding Scheme.

For information rich or a portion of data with visual patterns, the variance may become relatively large. In this respect, the variance may be employed as a selection criterion for a collected training sample set.

The intrinsic mode function coding scheme may include a search limited to code words with alternating signs. The search may be performed with respect to the collected training sample set. The following is an example of a procedure that is a part of the intrinsic mode function coding scheme:

1) Choose an acceptable integer K for a desired codebook size.

2) Run a K-mean algorithm to divide the training set into K clusters.

3) Compute the K-mean from the K clusters.

4) Decompose the K-mean n-tuple vectors with a Hilbert-Huang transformation to obtain three-order levels with restrictions on binary values.

5) Collect statistics on alternating functions across the three-order levels and build a codebook by entropy coding.

The approach described above is effective with approximately 2% of the training sample set. With entropy coding for the algorithm indicator, the alternating sign codebook contributes slightly negatively toward the overall performance. However, the approach provides an algorithm for handling important log patterns accurately. In addition, the average compression rate and burst compression rate can be averaged to make the resultant logs more relevant.

The dynamic range for azimuthal density data relates to the distribution of maximal bits required for each row (magnitude only). In this example, approximately 80% of cases can be represented by one bit if the sign bit is left out. In one or more implementations, the following entropic coding table (e.g., Table 4) can be used to denote the skewed dynamic range of the wavelet coefficients 304.

TABLE 4

Codebook for Dynamic Range Indicator

| Maximum Bit | Total Number in Set | Entropy Codes |
|---|---|---|
| 0 | 1282 | 00 |
| 1 | 6818 | 1 |
| 2 | 542 | 010 |
| 4 | 277 | 0110 |
| 8 | 66 | 01110 |
| 16 | 15 | 01111 |

The average maximal bit value for the set of wavelet coefficients processed by the compression system 400 yields approximately 1.39 bits per row, which is a significant saving compared with 3 bits in existing approaches for compression implementations. However, the maximal bit value may vary depending on implementation.

Figure 5:
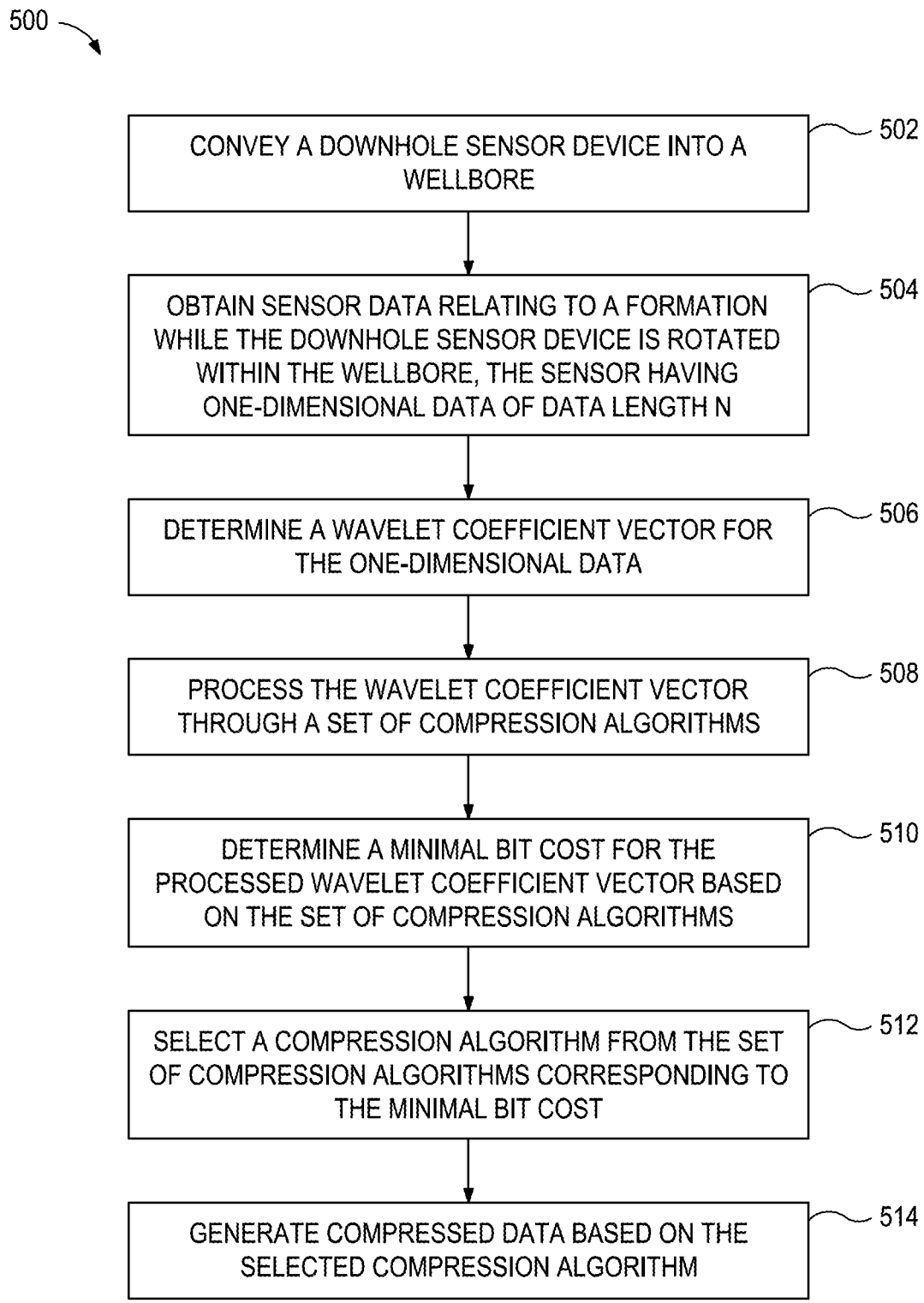
FIG. 5 is a flow chart of an exemplary process for downhole encoding of sparse data in accordance with one or more implementations of the present disclosure.

FIG. 5 is a flowchart of an exemplary process 500 for downhole acoustic caliper measurements using an exemplary downhole LWD logging system in accordance with one or more embodiments of the present disclosure. For explanatory purposes, the exemplary process 500 is described herein with reference to the drilling assembly 100 of FIG. 1; however, the example process 500 is not limited to the drilling assembly 100 of FIG. 1, and the exemplary process 500 may be performed by one or more components of the drilling assembly 100, such as the downhole tool 136, the downhole encoder 300 and/or the compression system 400. Further for explanatory purposes, the blocks of the exemplary process 500 are described herein as occurring in serial, or linearly. However, multiple blocks of the example process 500 may occur in parallel. In addition, the blocks of the exemplary process 500 need not be performed in the order shown and/or one or more of the blocks of the exemplary process 500 need not be performed.

In step 502, a downhole sensor device is conveyed into a borehole. In step 504, sensor data relating to a formation is obtained while the downhole sensor device is rotated within the borehole. The compression system 400 can receive the sensor data from the downhole sensor device. The sensor data can have one dimensional data of data length n, where n is a positive even integer.

In step 506, the compression system 400 can determine a wavelet coefficient vector for the one dimensional data. The wavelet coefficient vector may represent a hierarchical arrangement of the one dimensional data. In step 508, the compression system 400 can process the wavelet coefficient vector through a set of compression algorithms.

In step 510, the compression system 400 can determine a minimal bit cost of the processed wavelet coefficient vector based on the set of compression algorithms. In step 512, the compression system 400 can select a compression algorithm from the set of compression algorithms corresponding to the minimal bit cost. In step 514, the compression system 400 can generate compressed data based on the selected compression algorithm. The compression system 400 may encode an indication into the compressed data, in which the indication identifies the selected compression algorithm. The compression system 400 also may send the compressed data to a downhole signaling device or telemetry transmitter to send compressed data uphole from the wellbore to a surface decoder.

Figure 6:
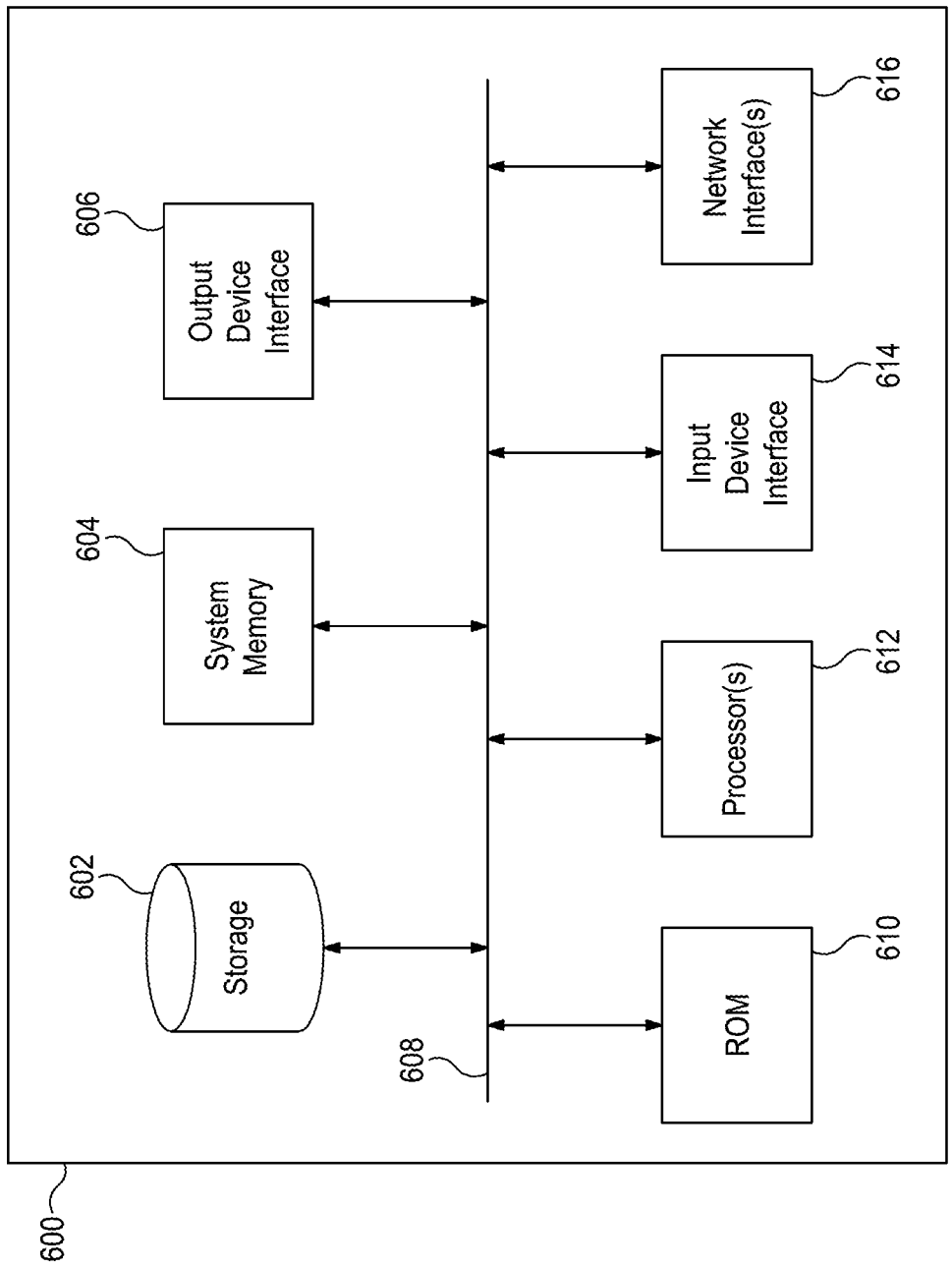
FIG. 6 conceptually illustrates an electronic system with which one or more implementations of the present disclosure may be implemented.

FIG. 6 conceptually illustrates an electronic system 600 with which one or more implementations of the present disclosure may be implemented. The electronic system 600, for example, may be, or may be coupled to, a sensor system, a desktop computer, a laptop computer, a tablet computer, a server, a receiver, or generally any electronic device that receives and transmits signals over a network. The electronic system 600 can be, and/or can be a part of, the downhole tool 136, the downhole encoder 300, the surface decoder 350, the quantization component 320, or the de-quantization component 370. Such an electronic system includes various types of computer readable media and interfaces for various other types of computer readable media. The electronic system 600 includes a bus 608, one or more processor(s) 612, a system memory 604 or buffer, a read-only memory (ROM) 610, a permanent storage device 602, an input device interface 614, an output device interface 606, and one or more network interface(s) 616, or subsets and variations thereof.

The bus 608 collectively represents all system, peripheral, and chipset buses that communicatively connect the numerous internal devices of the electronic system 600. In one or more implementations, the bus 608 communicatively connects the one or more processor(s) 612 with the ROM 610, the system memory 604, and the permanent storage device 602. From these various memory units, the one or more processor(s) 612 retrieve instructions to execute and data to process in order to execute the processes of the present disclosure. The one or more processor(s) 612 can be a single processor or a multi-core processor in different implementations.

The ROM 610 stores static data and instructions that are needed by the one or more processor(s) 612 and other modules of the electronic system 600. The permanent storage device 602, on the other hand, may be a read-and-write memory device. The permanent storage device 602 may be a non-volatile memory unit that stores instructions and data even when the electronic system 600 is off. In one or more implementations, a mass-storage device (such as a magnetic or optical disk and its corresponding disk drive) may be used as the permanent storage device 602.

In one or more implementations, a removable storage device (such as a floppy disk, flash drive, and its corresponding disk drive) may be used as the permanent storage device 602. Like the permanent storage device 602, the system memory 604 may be a read-and-write memory device. However, unlike the permanent storage device 602, the system memory 604 may be a volatile read-and-write memory, such as random access memory. The system memory 604 may store any of the instructions and data that one or more processor(s) 612 may need at runtime. In one or more implementations, the processes of the present disclosure are stored in the system memory 604, the permanent storage device 602, and/or the ROM 610. From these various memory units, the one or more processor(s) 612 retrieve instructions to execute and data to process in order to execute the processes of one or more implementations.

The bus 608 also connects to the input device interface 614 and the output device interface 606. The input device interface 614 enables a user to communicate information and select commands to the electronic system 600. Input devices that may be used with the input device interface 614 may include, for example, alphanumeric keyboards and pointing devices. The output device interface 606 may enable, for example, the display of images generated by the electronic system 600. Output devices that may be used with the output device interface 606 may include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

The bus 608 also may couple the electronic system 600 to one or more networks (not shown), the compression system 200, through one or more network interface(s) 616. One or more network interface(s) may include an Ethernet interface, a WiFi interface, or generally any interface for connecting to a network. In this manner, the electronic system 600 can be a part of one or more networks of computers (such as a local area network ("LAN"), a wide area network ("WAN"), or an Intranet, or a network of networks, such as the Internet. Any or all components of the electronic system 600 can be used in conjunction with the present disclosure.

The electronic system 600 is suitable for collecting, processing and displaying logging data. In one or more implementations, a user can interact with the electronic system 600 via the input device interface 614 to send one or more commands to drilling assembly 100 to adjust its operation in response to received logging data. In one or more implementations, the downhole tool 136 is coupled to the processor 612 via the bus 608 to enable the electronic system 600 to communicate with the drill assembly 100 including the drill bit 114. In accordance with user input received via the input device interface 614 and program instructions from the system memory 604 and/or the ROM 610, the processor 612 processes the received telemetry information received via the network interface 616 over the bus 608. The processor 612 can construct formation property logs (including one or more borehole wall images), and display them to the user via the output device interface 606.

To facilitate a better understanding of the present disclosure, the following examples of preferred or representative embodiments are given. In no way should the following examples be read to limit, or to define, the scope of the disclosure.

Embodiments disclosed herein include:

A. A system comprising a downhole sensor device configured to collect sensor data while the downhole sensor device is rotated within a borehole. The system comprises a compression device coupled to the downhole sensor device. The compression device is configured to receive the sensor data from the downhole sensor device. The sensor data having one or more rows of n-tuple vectors, where n is a positive even integer. The compression device can determine a wavelet coefficient vector for at least one row of the one or more rows of n-tuple vectors. The wavelet coefficient vector can have a sparse representation for an n-tuple vector in the at least one row. The compression device can process the wavelet coefficient vector through a set of compression algorithms. The compression device can determine a minimal bit cost of the processed wavelet coefficient vector based on the set of compression algorithms. The compression device can select a compression algorithm from the set of compression algorithms corresponding to the minimal bit cost. The compression device can generate compressed data based on the selected compression algorithm.

B. A method comprising conveying a downhole sensor device into a borehole and obtaining sensor data relating to a formation while the downhole sensor device is rotated within the borehole. The method includes receiving the sensor data from the downhole sensor device, the sensor data having one dimensional data of data length n, where n is a positive even integer. The method includes determining a wavelet coefficient vector for the one dimensional data. The wavelet coefficient vector representing a hierarchical arrangement of the one dimensional data. The method includes processing the wavelet coefficient vector through a set of compression algorithms. The method includes determining a minimal bit cost of the processed wavelet coefficient vector based on the set of compression algorithms. The method includes selecting a compression algorithm from the set of compression algorithms corresponding to the minimal bit cost. The method includes generating compressed data based on the selected compression algorithm. The method includes encoding an indication into the compressed data, the indication identifying the selected compression algorithm. The method further includes sending the compressed data uphole from the wellbore to a surface decoder.

C. An apparatus comprising one or more processors and memory comprising instructions that when executed by the one or more processors cause the apparatus to cause a downhole sensor device to be conveyed into a borehole and cause the downhole sensor device to collect sensor data while the downhole sensor device is rotated within the borehole. The instructions can cause the apparatus to receive the sensor data from the downhole sensor device. The sensor data can have one or more rows of n-tuple vectors, where n is a positive even integer. The instructions can cause the apparatus to determine a wavelet coefficient vector for at least one row of the one or more rows of n-tuple vectors. The wavelet coefficient vector can have a sparse representation of one or more nonzero elements. The instructions can cause the apparatus to process the wavelet coefficient vector through a set of compression algorithms. The instructions can cause the apparatus to determine a bit cost of the processed wavelet coefficient vector for each compression algorithm of the set of compression algorithms. The instructions can cause the apparatus to select a compression algorithm from the set of compression algorithms corresponding to one of the determined bit costs having a minimal bit cost. The instructions can cause the apparatus to generate compressed data based on the selected compression algorithm. The instructions can cause the apparatus to encode an indication into the compressed data, the indication identifying the selected compression algorithm. The instructions can cause the apparatus to send the compressed data uphole from the wellbore to a surface decoder.

Embodiment A may have one or more of the following additional elements in any combination: Element 1: wherein the compression device is configured to apply a wavelet transform to the one or more rows of n-tuple vectors; Element 2: wherein the compression device is configured to obtain a sparse representation for each row of the one or more rows of n-tuple vectors; Element 3: wherein the wavelet coefficient vector represents a data structure having a hierarchical arrangement of quantized coefficients; Element 4: wherein the set of compression algorithms includes one or more of a nonzero tree coding scheme, a run-length coding scheme, a priority coding scheme, or an intrinsic mode function coding scheme; Element 5: wherein the compression device is configured to select between the nonzero tree coding scheme or a zero tree coding scheme based on a number of zeroes in the wavelet coefficient vector; Element 6: wherein the compression device is configured to determine a bit cost for each compression algorithm of the set of compression algorithms, the minimal bit cost corresponding to one of the determined bit costs; Element 7: wherein the compression device is configured to encode an indication into the compressed data, the indication identifying the selected compression algorithm; Element 8: wherein the compression device is configured to send the compressed data uphole from the wellbore to a surface decoder; Element 9: wherein the compressed data is sent in a transmission vector having a second data length, and wherein the data length of the n-tuple vectors is greater than the second data length.

Embodiment B may have one or more of the following additional elements in any combination: Element 10: wherein determining the minimal bit cost comprises determining a bit cost for each compression algorithm of the set of compression algorithms, the minimal bit cost corresponding to one of the determined bit costs; Element 11: wherein the set of compression algorithms includes one or more of a nonzero tree coding scheme, a run-length coding scheme, a priority coding scheme, or an intrinsic mode function coding scheme; Element 12: wherein processing the wavelet coefficient vector comprises determining one or more positions of nonzeroes in the wavelet coefficient vector based on the nonzero tree coding scheme; Element 13: wherein processing the wavelet coefficient vector comprises determining a length of a zero-run sequence based on the run-length coding scheme, the wavelet coefficient vector having at least one nonzero element; Element 14: wherein processing the wavelet coefficient vector comprises determining a power ratio of coded coefficients to total coefficients based on the priority coding scheme, the priority coding scheme comprising coding wavelet coefficients included in one of a plurality of levels in the hierarchical arrangement; determining the power ratio of the coded wavelet coefficients over the total coefficients; and determining if the power ratio is greater than a predetermined threshold, the threshold corresponding to one quantization level; Element 15: further comprising coding wavelet coefficients included in a different level of the plurality of levels based on the power ratio determined not to be greater than the predetermined threshold; and determining that the power ratio of the coded wavelet coefficients in the different level is greater than the predetermined threshold; Element 16: wherein processing the wavelet coefficient vector comprises determining a codebook with alternating functions of binary values based on the intrinsic mode function coding scheme; Element 17: further comprising determining a training sample set from the wavelet coefficient vector; determining an integer K for a desired size of the codebook; apply a K-mean algorithm on the training sample set to divide the training sample set into K clusters; determining a K-mean from the K-clusters; decomposing n-tuple vectors of the training sample set having the K-mean by a Hilbert-Huang transformation; obtaining statistics on the alternating functions included in the decomposed vectors; and forming the codebook using entropy coding based on the obtained statistics.

By way of non-limiting example, embodiment A may be combined with: Elements 1 and 2; Elements 4 and 5; Elements 8 and 9; etc.

Further by way of non-limiting example, embodiment B may be combined with: Elements 10 and 11; Elements 11 and 12; Elements 11 and 13; Elements 11 and 14; Elements 11, 14 and 15; Elements 11 and 16; Elements 11, 16 and 17; etc.

Therefore, the disclosed systems and methods are well adapted to attain the ends and advantages mentioned as well as those that are inherent therein. The particular embodiments disclosed above are illustrative only, as the teachings of the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope of the present disclosure. The systems and methods illustratively disclosed herein may suitably be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the elements that it introduces. If there is any conflict in the usages of a word or term in this specification and one or more patent or other documents that may be incorporated herein by reference, the definitions that are consistent with this specification should be adopted.

As used herein, the phrase "at least one of" preceding a series of items, with the terms "and" or "or" to separate any of the items, modifies the list as a whole, rather than each member of the list (i.e., each item). The phrase "at least one of" allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The use of directional terms such as above, below, upper, lower, upward, downward, left, right, uphole, downhole and the like are used in relation to the illustrative embodiments as they are depicted in the figures, the upward direction being toward the top of the corresponding figure and the downward direction being toward the bottom of the corresponding figure, the uphole direction being toward the surface of the well and the downhole direction being toward the toe of the well.

What is claimed is:

1. A system, comprising:
    a downhole sensor device configured to collect sensor data while the downhole sensor device is within a borehole;
    a compression device coupled to the downhole sensor device, the compression device configured to:
        receive the sensor data from the downhole sensor device, the sensor data having one or more rows of n-tuple vectors where n is a positive even integer, and the sensor data corresponding to image data;
        determine a wavelet coefficient vector for at least one row of the one or more rows of n-tuple vectors;
        process the wavelet coefficient vector through each of a set of compression algorithms;
        determine a minimal bit cost of the processed wavelet coefficient vector based, at least in part, on processing the wavelet coefficient vector through each of the set of compression algorithms;
        select a compression algorithm from the set of compression algorithms based, at least in part, on the minimal bit cost;
        generate compressed data from the wavelet coefficient vector based on the selected compression algorithm; and
        encode an indication into the compressed data, the indication identifying the selected compression algorithm; and
    a transmitter configured to transmit the compressed data uphole to facilitate a drilling operation in the borehole.

2. The system of claim 1, wherein the compression device is configured to obtain a sparse representation for each row of the one or more rows of n-tuple vectors.

3. The system of claim 1, wherein the set of compression algorithms includes one or more of a nonzero tree coding scheme, a run-length coding scheme, a priority coding scheme, or an intrinsic mode function coding scheme.

4. The system of claim 3, wherein the compression device is configured to select between the nonzero tree coding scheme or a zero tree coding scheme based on a number of zeroes in the wavelet coefficient vector.

5. The system of claim 1, wherein the compression device is configured to determine a bit cost for each compression algorithm of the set of compression algorithms, the minimal bit cost corresponding to one of the determined bit costs.

6. The system of claim 1, wherein the transmitter is configured to transmit the compressed data uphole from the borehole to a surface decoder via a low data rate communication channel.

7. The system of claim 1, wherein the compressed data is sent in a transmission vector having a second data length, wherein a data length of the n-tuple vectors is greater than the second data length.

8. A method, comprising:
    receiving sensor data relating to a formation from a downhole sensor device, the sensor data corresponding to image data having one dimensional data of data length n, where n is a positive even integer;
    determining a wavelet coefficient vector for the one dimensional data, the wavelet coefficient vector representing a hierarchical arrangement of the one dimensional data;
    processing the wavelet coefficient vector through each of a set of compression algorithms;

determining a minimal bit cost of the processed wavelet coefficient vector based, at least in part, on processing the wavelet coefficient vector through each of the set of compression algorithms;

selecting a compression algorithm from the set of compression algorithms based, at least in part, on the minimal bit cost; and generating compressed data based on the selected compression algorithm; and encoding an indication into the compressed data, the indication identifying the compression algorithm; and sending the compressed data uphole from the borehole to a surface decoder to provide frequent image updates with respect to a drilling operation in the borehole.

9. The method of claim 8, wherein determining the minimal bit cost comprises determining a bit cost for each compression algorithm of the set of compression algorithms, the minimal bit cost corresponding to one of the determined bit costs.

10. The method of claim 9, wherein the set of compression algorithms includes one or more of a nonzero tree coding scheme, a run-length coding scheme, a priority coding scheme, or an intrinsic mode function coding scheme.

11. The method of claim 10, wherein processing the wavelet coefficient vector comprises determining one or more positions of nonzeroes in the wavelet coefficient vector based on the nonzero tree coding scheme.

12. The method of claim 10, wherein processing the wavelet coefficient vector comprises determining a length of a zero-run sequence based on the run-length coding scheme, the wavelet coefficient vector having at least one nonzero element.

13. The method of claim 10, wherein processing the wavelet coefficient vector comprises determining a power ratio of coded coefficients to total coefficients based on the priority coding scheme, the priority coding scheme comprising:

coding wavelet coefficients included in one of a plurality of levels in the hierarchical arrangement;

determining the power ratio of the coded wavelet coefficients over the total coefficients; and determining if the power ratio is greater than a predetermined threshold, the threshold corresponding to one quantization level.

14. The method of claim 13, further comprising:

coding wavelet coefficients included in a different level of the plurality of levels based on the power ratio determined not to be greater than the predetermined threshold; and determining that the power ratio of the coded wavelet coefficients in the different level is greater than the predetermined threshold.

15. The method of claim 10, wherein processing the wavelet coefficient vector comprises determining a codebook with alternating functions of binary values based on the intrinsic mode function coding scheme.

16. The method of claim 15, further comprising:

determining a training sample set from the wavelet coefficient vector;

determining an integer K for a desired size of the codebook;

applying a K-mean algorithm on the training sample set to divide the training sample set into K clusters;

determining a K-mean from the K clusters;

decomposing n-tuple vectors of the training sample set having the K-mean by a Hilbert-Huang transformation;

obtaining statistics on the alternating functions included in the decomposed vectors; and forming the codebook using entropy coding based on the obtained statistics.

17. The method of claim 8, wherein the image data comprises one or more of azimuthal density data, azimuthally focused resistivity data, azimuthally deep resistivity, azimuthal acoustic compressional and shear images, acoustic borehole caliper and reflectance, and spectral natural gamma ray and non-spectral natural gamma imaging.

18. An apparatus comprising:

one or more processors; and memory comprising instructions that when executed by the one or more processors cause the one or more processors to:

determine a wavelet coefficient vector for at least one row of one or more rows of n-tuple vectors in image data from a downhole sensor, the wavelet coefficient vector having a sparse representation of one or more nonzero elements;

process the wavelet coefficient vector through each of a set of compression algorithms;

determine a bit cost of the processed wavelet coefficient vector for each compression algorithm of the set of compression algorithms;

select a compression algorithm from the set of compression algorithms corresponding to the minimal one of the determined bit costs;

generate compressed data based on the selected compression algorithm;

encode an indication into the compressed data, the indication identifying the selected compression algorithm; and send the compressed data uphole from the borehole to a surface decoder to facilitate a drilling operation in the borehole.

19. The apparatus of claim 18, wherein the image data comprises one or more of azimuthal density data, azimuthally focused resistivity data, azimuthally deep resistivity, azimuthal acoustic compressional and shear images, acoustic borehole caliper and reflectance, and spectral natural gamma ray and non-spectral natural gamma imaging.

* * * * *